(12) United States Patent
Granier et al.

(10) Patent No.: US 10,795,833 B2
(45) Date of Patent: Oct. 6, 2020

(54) TRAY FOR AVIONICS BAY COMPRISING A RECORDING DEVICE, ASSOCIATED AVIONICS BAY AND AIRCRAFT

(71) Applicants: Airbus SAS, Blagnac (FR); Airbus Operations SAS, Toulouse (FR)

(72) Inventors: Xavier Granier, Lespinasse (FR); Alain Lagarrigue, Rouffiac Tolosan (FR); David Cumer, Pin-Balma (FR)

(73) Assignees: AIRBUS SAS, Blagnac (FR); AIRBUS OPERATIONS SAS, Toulouse (FR)

( * ) Notice: Subject to any disclaimer, the term of this patent is extended or adjusted under 35 U.S.C. 154(b) by 0 days.

(21) Appl. No.: 16/661,537

(22) Filed: Oct. 23, 2019

(65) Prior Publication Data
US 2020/0133894 A1    Apr. 30, 2020

(30) Foreign Application Priority Data
Oct. 25, 2018  (FR) ...................... 18 59893

(51) Int. Cl.
*G06F 3/06* (2006.01)
*G06F 13/16* (2006.01)
*H04W 72/04* (2009.01)

(52) U.S. Cl.
CPC .............. *G06F 13/16* (2013.01); *G06F 3/061* (2013.01); *G06F 3/0655* (2013.01); *G06F 3/0673* (2013.01); *H04W 72/0453* (2013.01); *G06F 2213/16* (2013.01)

(58) Field of Classification Search
None
See application file for complete search history.

(56) References Cited

U.S. PATENT DOCUMENTS

| 2005/0047065 A1 | 3/2005 | Cooper et al. |
| 2006/0234787 A1 | 10/2006 | Lee et al. |
| 2017/0018125 A1 | 1/2017 | Jover et al. |
| 2017/0295034 A1 | 10/2017 | Saint-Etienne et al. |

FOREIGN PATENT DOCUMENTS

| FR | 3038994 A1 | 1/2017 |
| FR | 3050086 A1 | 10/2017 |
| WO | 2007039097 A1 | 4/2007 |

OTHER PUBLICATIONS

French Search Report; priority document.

*Primary Examiner* — Scott C Sun
(74) *Attorney, Agent, or Firm* — Greer, Burns & Crain, Ltd.

(57) ABSTRACT

A tray for an avionics bay, comprising a body and a recording device rigidly connected to each other in order to reduce the space requirement of acquisition systems on board an aircraft and dedicated to the prediction of failures. The recording device comprises a first input/output port to be connected to the avionics bay, a second input/output port to be connected to an item of electrical equipment, a data bus for routing signals between the first and the second input/output port, a collection member configured for acquiring at least some of the signals routed by the data bus between the first and the second input/output port, and a memory configured to store the signals acquired by the collection member.

6 Claims, 2 Drawing Sheets

TRAY FOR AVIONICS BAY COMPRISING A RECORDING DEVICE, ASSOCIATED AVIONICS BAY AND AIRCRAFT

CROSS-REFERENCES TO RELATED APPLICATIONS

This application claims the benefit of the French patent application No. 1859893 filed on Oct. 25, 2018, the entire disclosures of which are incorporated herein by way of reference.

FIELD OF THE INVENTION

The present invention relates to a tray intended to be mounted in an avionics bay of an aircraft, the tray comprising a body configured for supporting electrical equipment received into the avionics bay.

"Tray" is understood, within the meaning of the present invention, as a device serving as a mechanical (optionally electrical) interface between an avionics bay, more precisely a housing of an avionics bay, and electrical equipment arranged in the housing. The tray receives the electrical equipment and acts as a support for the latter.

The invention also relates to an aircraft avionics bay provided with at least one such tray, and an aircraft provided with such an avionics bay.

The invention applies to the field of aeronautics, in particular to aircraft maintenance.

BACKGROUND OF THE INVENTION

Recent developments regarding aircraft maintenance have led to the introduction of methods making it possible to predict failures on board an aircraft and to anticipate them, notably by replacing the defective parts before the occurrence of faults. In this way, the risks of flight delay and cancellation are reduced.

Such predictive methods require the acquisition of volumes of data that are several tens of times greater than the volumes of data usually analyzed. Such data are typically data exchanged between the aircraft's computers and/or data routed to the aircraft's computers originating from, for example, the various sensors with which the aircraft is provided.

However, such predictive methods are accompanied by certain drawbacks. In particular, the large volumes of data to be collected require the implementation of special acquisition systems capable of acquiring and storing such volumes of data.

Such acquisition systems are generally arranged in the aircraft near an aircraft's avionics bay supporting the computer(s), which increases the space requirement on board the aircraft, in particular in the vicinity of the avionics bay.

In addition, the setting up of such acquisition systems on board an aircraft is often tedious, in that the architectures are likely to vary from one manufacturer to another, which generally requires the construction of customized acquisition systems and the installation of a lot of special wiring for capturing this data.

One object of the invention is therefore to provide an acquisition system that is versatile, the spatial requirement for which is minimal, and which does not require special wiring or the installation of separate and dedicated computers in the avionics bay.

SUMMARY OF THE INVENTION

To this end, the invention relates to a tray of the aforementioned type further comprising a recording device comprising:
- a first input/output port intended to be connected to a connector of the avionics bay;
- a second input/output port intended to be connected to a connector of the electrical equipment;
- a data bus connected between the first input/output port and the second input/output port and configured for routing signals between the first input/output port and the second input/output port;
- a collection member configured for acquiring at least a part of the signals routed by the data bus between the first input/output port and the second input/output port; and
- a memory configured for storing the signals acquired by the collection member, the recording device being rigidly connected to the body.

Indeed, since the recording device is incorporated in the tray, the tray is provided with an additional function, in addition to its conventional function of support and/or electrical power supply for the electrical equipment. For its use, the tray according to the invention is inserted in the usual location of a conventional tray in an avionics bay, its first input/output port connected to the avionics bay and its second input/output port connected to electrical equipment that the tray supports. It follows that no modification in the structure of the avionics bay or that of the electrical equipment is required, regardless of their builder or manufacturer, which offers great versatility to the tray according to the invention, and enables it to be used on board the vast majority of aircraft.

In addition, during the use of the tray according to the invention, the recording device is located in the avionics bay, so that it does not generate any additional space requirement with respect to the situation where a conventional tray is implemented.

According to other advantageous aspects of the invention, the tray comprises one or more of the following features, taken in isolation or according to all technically possible combinations:
- the recording device further comprises a wireless communication module configured for transmitting in at least one predetermined frequency band, all or part of the acquired signals stored in the memory;
- the wireless communication module is configured for applying a compression method to all or part of the acquired signals stored in the memory before their transmission; and
- the first input/output port and the second input/output port are connectors compliant with an international aeronautics standard ARINC600.

In addition, the invention relates to an aircraft avionics bay provided with at least one tray as defined above.

In addition, the invention relates to an aircraft provided with an avionics bay as defined above.

BRIEF DESCRIPTION OF THE DRAWINGS

The invention will be better understood with the aid of the following description, given solely by way of a non-restrictive example and referring to the appended drawings, in which.

DETAILED DESCRIPTION OF THE PREFERRED EMBODIMENTS

Figure 1:
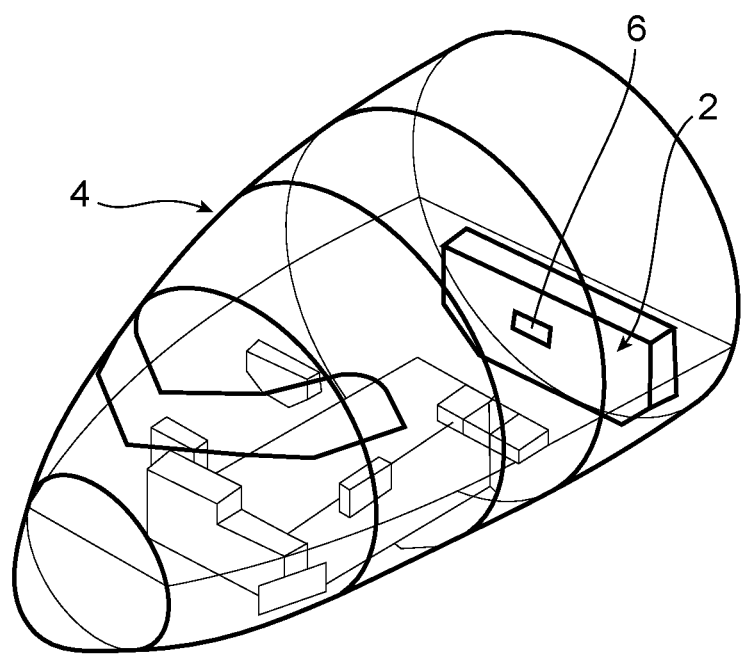
FIG. 1 is a perspective schematic view of an aircraft comprising an avionics bay according to the invention.

An avionics bay 2 of an aircraft 4 is illustrated in FIG. 1.

The avionics bay 2 is intended to accommodate at least one item of electrical equipment 6 in a corresponding housing. The electrical equipment 6 is notably a computer.

The avionics bay 2 is also intended to provide the electrical power supply needed to operate the electrical equipment 6. In addition, the avionics bay 2 is suitable for providing, at a connector of the avionics bay 2, hereafter referred to as an "avionics connector," signals intended to be processed by the electrical equipment 6. Such an avionics connector is schematically represented in FIG. 3 by the reference 8.

Figure 3:
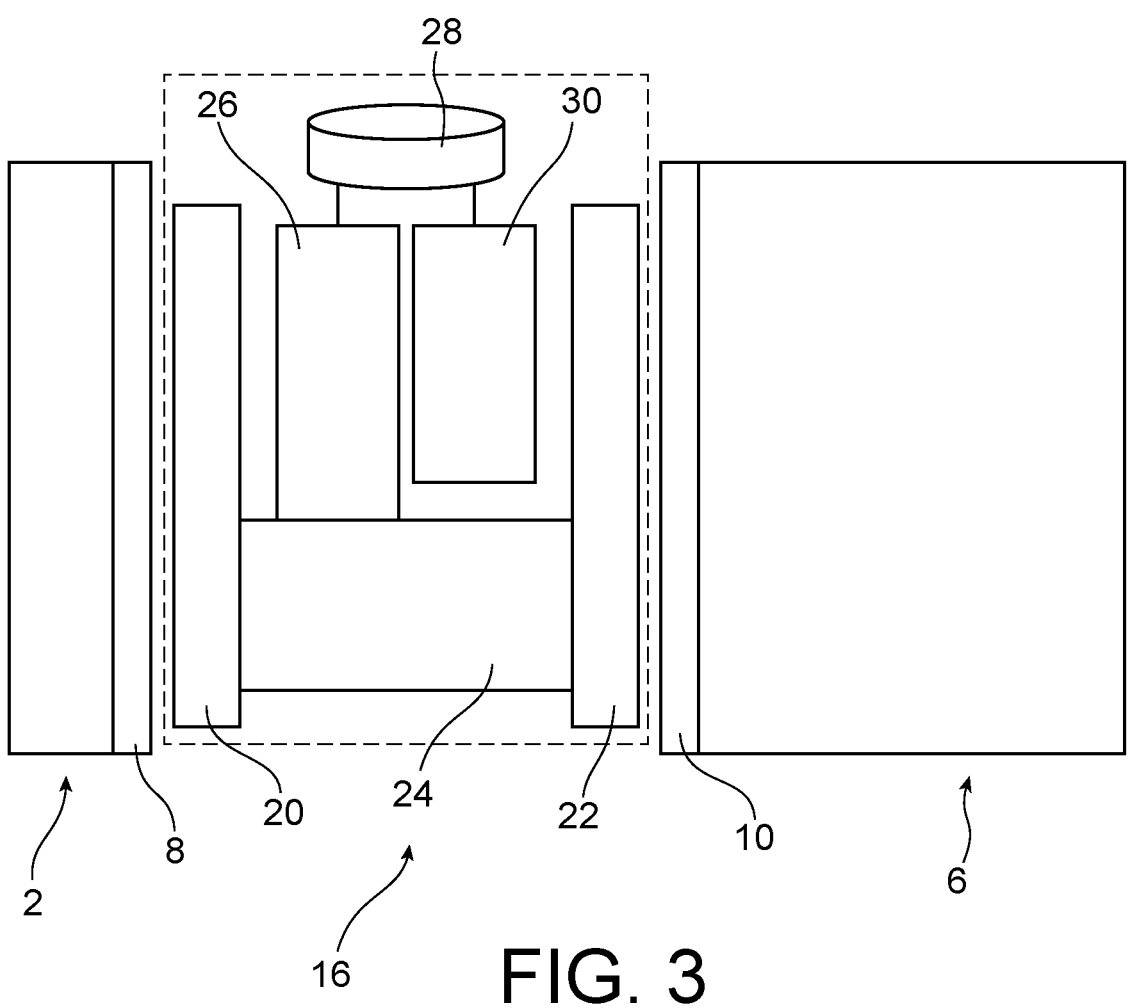
FIG. 3 is a schematic representation of an acquisition device incorporated in the tray in FIG. 2.

The avionics bay 2 is also suitable for receiving signals delivered by the electrical equipment 6 at a connector 10 of the electrical equipment 6, hereafter referred to as an "equipment connector." Such an equipment connector is schematically represented in FIG. 3.

Conventionally, the connectors 8, 10 are connectors defined by a current international aeronautics standard, such as "ARINC600," connectors compatible with a switched Ethernet network in full-duplex mode for aeronautics (also referred to as an AFDX® or "Avionics Full DupleX switched Ethernet" network), or audio connectors.

Figure 2:
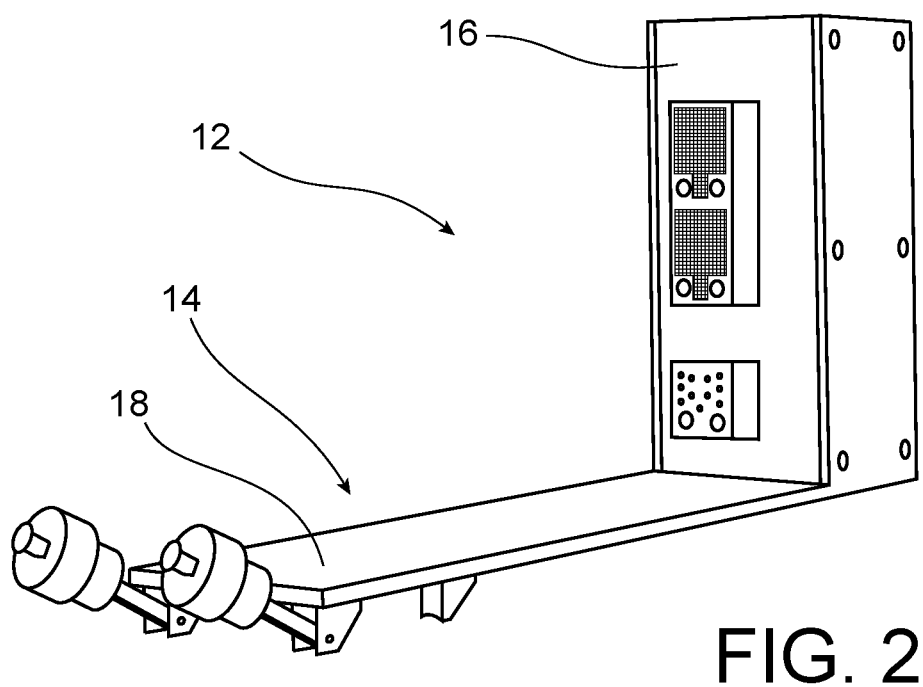
FIG. 2 is a perspective schematic view of a tray with which the avionics bay in FIG. 1 is provided.

The avionics bay 2 comprises at least one tray 12 according to the invention, illustrated in FIG. 2.

Each tray 12 comprises a body 14 and incorporates a recording device 16 rigidly connected to the body 14.

The body 14 is intended to rest on a shelf corresponding to the tray 12 of a housing of the avionics bay 2, and to mechanically support corresponding electrical equipment 6. Conventionally, the body 14 comprises a flat, elongated part 18 forming a seat for the electrical equipment 6.

Preferably, and as can be seen in FIG. 2, the recording device 16 is arranged in a rear area of the body 14 of the tray 12, so as to be located between the avionics bay 2 and the electrical equipment 6 when the electrical equipment 6 is installed in the avionics bay 2. In other words, in this case, the recording device 16 is located behind the electrical equipment 6 when it faces same, once the electrical equipment 6 is inserted into the corresponding housing of the avionics bay 2.

The recording device 16 is configured for acquiring and storing the signals exchanged between the avionics bay 2 and the electrical equipment 6.

As illustrated in FIG. 3, the recording device 16 comprises a first input/output port 20, a second input/output port 22, a data bus 24 connected between the first input/output port 20 and the second input/output port 22, a collection member 26 and a memory 28.

The first input/output port 20 is intended to be connected to the avionics connector 8 of the avionics bay 2. Consequently, the first input/output port 20 is compatible with the standard according to which the avionics connector 8 is produced; in particular, the first input/output port 20 is produced according to the same standard as the avionics connector 8.

The second input/output port 22 is intended to be connected to the equipment connector 10 of the electrical equipment 6. Consequently, the second input/output port 22 is compatible with the standard according to which the equipment connector 10 is produced; in particular, the second input/output port 22 is produced according to the same standard as the equipment connector 10.

This is advantageous, in that no intervention on the avionics bay 2 or the electrical equipment 6 is required for ensuring compatibility between the avionics bay 2, the electrical equipment 6 and the recording device 16 of the tray 12.

For example, the first input/output port 20 and the second input/output port 22 are connectors compliant with an international aeronautics standard "ARINC600."

The data bus 24 is configured for routing signals between the first input/output port 20 and the second input/output port 22. More precisely, the data bus 24 is configured, during the use of the tray 12 according to the invention, for routing between the first input/output port 20 connected to the avionics connector 8 and the second input/output port 22 connected to the equipment connector 10, the signals delivered by the avionics bay 2 and by the electrical equipment 6 at the avionics connector 8 and the equipment connector 10 respectively.

Consequently, the data bus 24 is compatible with the standard according to which the avionics 8 and equipment 10 connectors are produced; in particular, the data bus 24 is produced according to the same standard as the avionics 8 and equipment 10 connectors, thus making it possible to transmit the same signals.

The collection member 26 is connected to the data bus 24. The collection member 26 is configured for acquiring all or part of the signals routed by the data bus 24 between the first input/output port 20 and the second input/output port 22. In other words, the collection member 26 acquires the signals travelling on the data bus 24 without impeding their movement between the first input/output port 20 and the second input/output port 22.

For example, a configuration file stored in the recording device 16 defines the nature of the data to be acquired by the collection member 26.

The memory 28 is connected to the collection member 26. The memory 28 is configured for storing the signals acquired by the collection member 26. For example, the memory 28 is a flash memory.

Preferably, the memory 28 has a capacity of several tens of gigabytes.

Advantageously, the recording device 16 further comprises a wireless communication module 30 connected to the memory 28.

The wireless communication module 30 is configured for transmitting, in at least one predetermined frequency band, the signals acquired by the collection member 26 which have been stored in the memory 28. Preferably, the wireless communication module 30 is configured for transmitting, when the aircraft 4 is in a predetermined situation, the acquired signals stored in the memory 28. By way of example, the wireless communication module 30 is configured for transmitting the acquired signals stored in the memory 28 according to a flight phase of the aircraft 4, e.g., as soon as the aircraft 4 is on the ground.

Since the recording device 16 is generally inaccessible without the removal of the electrical equipment 6 from the corresponding housing of the avionics bay 2, the presence of such a wireless communication module 30 is advantageous in that it makes such a removal of the electrical equipment 6 from its housing unnecessary for reading data stored in the memory 28.

The wireless communication module 30 is, for example, configured for transmitting the acquired signals in at least one frequency band defined by the "IMT-Advanced" specifications laid down by the standards organizations ITU-R and ETSI (usually referred to as "4G standards").

Preferably, the wireless communication module 30 is configured for transmitting all or part of the signals acquired by the collection member 26 which have been stored in the memory 28, in order to limit the volume of data transmitted. For example, the configuration file defines the nature of the data to be transmitted by the wireless communication module 30.

Advantageously, the wireless communication module 30 is configured for applying a compression method to the signals before their transmission, in order to reduce the volume of data transmitted.

The operation of the tray 12 will now be described.

First, the tray 12 is arranged in a corresponding housing of the avionics bay 2. The first input/output port 20 of the tray 12 is connected to the avionics connector 8 associated with the housing of the avionics bay 2. For example, the first input/output port 20 is engaged with the avionics connector 8.

Then, the electrical equipment 6 is received into the housing, the electrical equipment 6 being supported by the tray 12, in particular by the part 18 of the body 14 of the tray 12. The second input/output port 22 of the tray 12 is connected to the equipment connector 10 of the electrical equipment 6. For example, the second input/output port 22 is engaged with the equipment connector 10.

In operation, signals originating from the avionics bay 2 and intended for the electrical equipment 6 are available at the avionics connector 8. The tray 12 receives the input signals, at its first input/output port 20, and routes them to the second input/output port 22 via the data bus 24. The collection member 26 acquires the signals routed by the data bus 24 to the second input/output port 22 from the first input/output port 20, and the memory 28 stores the signals acquired by the collection member 26. The signals routed by the data bus 24, available at the second input/output port 22, are applied to the equipment connector 10 for their processing by the electrical equipment 6.

In a similar way, signals originating from the electrical equipment 6 and intended to pass through the avionics bay 2 are available at the equipment connector 10. The tray 12 receives the input signals, at its second input/output port 22, and routes them to the first input/output port 20 via the data bus 24. The collection member 26 acquires the signals routed by the data bus 24 to the first input/output port 20 from the second input/output port 22, and the memory 28 stores the signals acquired by the collection member 26. The signals routed by the data bus 24, available at the first input/output port 20, are applied to the avionics connector 8 for their routing by the avionics bay 2.

When the aircraft is in a predetermined situation, e.g., as soon as it is detected that the aircraft is on the ground, e.g., transmitted by an operator, or automatically transmitted during a read procedure of the memory 28, the wireless communication module 30 transmits, in at least one predetermined frequency band, the signals stored in the memory 28 which have been acquired by the collection member 26.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A tray configured to be mounted in an avionics bay of an aircraft, the tray comprising
   a body configured to support electrical equipment received into the avionics bay, and
   a recording device comprising:
      a first input/output port configured to be connected to a connector of the avionics bay;
      a second input/output port configured to be connected to a connector of the electrical equipment;
      a data bus connected between the first input/output port and the second input/output port and configured to rout signals between the first input/output port and the second input/output port;
      a collection member configured to acquire at least some of the signals routed by the data bus between the first input/output port and the second input/output port; and
      a memory configured to store the signals acquired by the collection member,
   wherein the recording device is rigidly connected to the body.

2. The tray according to claim 1, wherein the recording device further comprises a wireless communication module configured to transmit in at least one predetermined frequency band, all or part of the acquired signals stored in the memory.

3. The tray according to claim 2, wherein the wireless communication module is configured to apply a compression method to all or part of the acquired signals stored in the memory before their transmission.

4. The tray according to claim 1, wherein the first input/output port and the second input/output port are connectors compliant with a current international aeronautics standard for electrical connectors.

5. An avionics bay of an aircraft provided with at least one tray according to claim 1.

6. An aircraft provided with an avionics bay according to claim 5.

* * * * *